United States Patent
Hellberg

(10) Patent No.: US 8,305,146 B2
(45) Date of Patent: Nov. 6, 2012

(54) MULTI STAGE AMPLIFIER

(75) Inventor: Richard Hellberg, Huddinge (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 13/141,636

(22) PCT Filed: Dec. 22, 2008

(86) PCT No.: PCT/SE2008/051545
§ 371 (c)(1),
(2), (4) Date: Jun. 22, 2011

(87) PCT Pub. No.: WO2010/074615
PCT Pub. Date: Jul. 1, 2010

(65) Prior Publication Data
US 2011/0254629 A1    Oct. 20, 2011

(51) Int. Cl.
*H03F 3/68* (2006.01)
(52) U.S. Cl. .................... 330/295; 330/124 R
(58) Field of Classification Search ............ 330/84, 330/126, 124 R, 295
See application file for complete search history.

(56) References Cited

U.S. PATENT DOCUMENTS

| | | | | |
|---|---|---|---|---|
| 5,025,225 A * | 6/1991 | Tajima et al. | ............ | 330/124 D |
| 5,543,751 A * | 8/1996 | Stedman et al. | .......... | 330/124 D |
| 7,221,219 B2 * | 5/2007 | Hellberg et al. | .......... | 330/124 R |
| 7,279,971 B2 * | 10/2007 | Hellberg et al. | .......... | 330/124 R |
| 7,411,449 B2 * | 8/2008 | Klingberg et al. | ........ | 330/124 R |
| 7,893,762 B2 * | 2/2011 | Hellberg et al. | .......... | 330/124 R |
| 8,130,043 B2 * | 3/2012 | Arell | ............................. | 330/302 |

FOREIGN PATENT DOCUMENTS

WO   WO 2004/057755 A1   7/2004
WO   WO 2005/031966 A1   4/2005

OTHER PUBLICATIONS

International Preliminary Report on Patentability, PCT Application No. PCT/EP2008/051545, Mar. 16, 2011 (9 pages).

* cited by examiner

*Primary Examiner* — Henry Choe
(74) *Attorney, Agent, or Firm* — Myers Bigel Sibley & Sajovec, P.A.

(57) ABSTRACT

A multi-stage amplifier includes a first, a second, and a third sub-amplifier, each with respective input and output ports. The multi-stage amplifier also includes a common output port. The output port of the second sub-amplifier is connected to the output port of the first sub-amplifier as well as to the common output port of the multi-stage amplifier, and the output port of the third sub-amplifier is connected to the common output port. The electrical lengths of the connections from the second sub-amplifier's output port both to the first amplifier's output port and to the common output port are longer or shorter than one quarter of a wavelength ($\lambda$) of the frequency for which the multi-stage amplifier is intended to operate.

12 Claims, 6 Drawing Sheets

MULTI STAGE AMPLIFIER

CROSS REFERENCE TO RELATED APPLICATIONS

This application is a 35 U.S.C. §371 national stage application of PCT International Application No. PCT/SE2008/051545, filed on 22 Dec. 2008, the disclosure and content of which is incorporated by reference herein in its entirety. The above-referenced PCT International Application was published in the English language as International Publication No. WO 2010/074615 A1 on 1 Jul. 2010.

TECHNICAL FIELD

The present invention discloses an improved multi-stage amplifier which has Chireix properties.

BACKGROUND

So called Chireix amplifiers are examples of RF amplifiers which are based on multiple transistors with passive output network interaction which gives a high average efficiency for amplitude-modulated signals.

Such amplifiers, i.e. amplifiers based on passive output network interaction structures have a general advantage in that they need only fundamental (i.e. RF) frequency network and signal modifications; compared to single-transistor amplifiers they differ in the number of independently driven transistors. Many other types of high-efficiency amplifiers require harmonics and/or baseband modifications, features which are optional for amplifiers based on passive output network interaction structures.

However, one problem in amplifiers based on passive output network interaction structures is transistor shunt loss. This loss is due to resistive parasitics that couple the output node of the devices to ground. This problem is emphasized by the operation of multi-transistor amplifiers, which decrease the transistors' RF output currents (which is the reason for their high efficiency) at the expense of increased RF output voltages.

SUMMARY

As explained above, there is a need for an amplifier which is based on multiple transistors with passive output network interaction which has lower shunt losses than previously known such transistors.

This need is addressed by the present invention in that it discloses a multi-stage amplifier which comprises a first, a second and a third sub-amplifier, each of which has an input port and an output port. In addition, the multi-stage amplifier of the invention also has a common output port.

In the multi stage amplifier which is disclosed by the invention, the output port of the second sub-amplifier is connected to the output port of the first sub-amplifier as well as to the common output port of the multi-stage amplifier and the output port of the third sub-amplifier is connected to the common output port.

The electrical length of the connections from the second sub-amplifier's output port both to the first amplifier's output port and to the common output port are longer or shorter than one quarter of a wavelength of the frequency for which the multi-stage amplifier is intended to operate.

As will be shown in the detailed description of this text, by means of this design of the amplifier of the invention, a high degree of efficiency is obtained.

In one embodiment of the invention, the multi-stage amplifier additionally comprises a fourth sub-amplifier with an input port and an output port which is connected to the output port of the third sub-amplifier.

BRIEF DESCRIPTION OF THE DRAWINGS

The invention will be described in more detail in the following, with reference to the appended drawings, in which.

DETAILED DESCRIPTION

Figure 1:
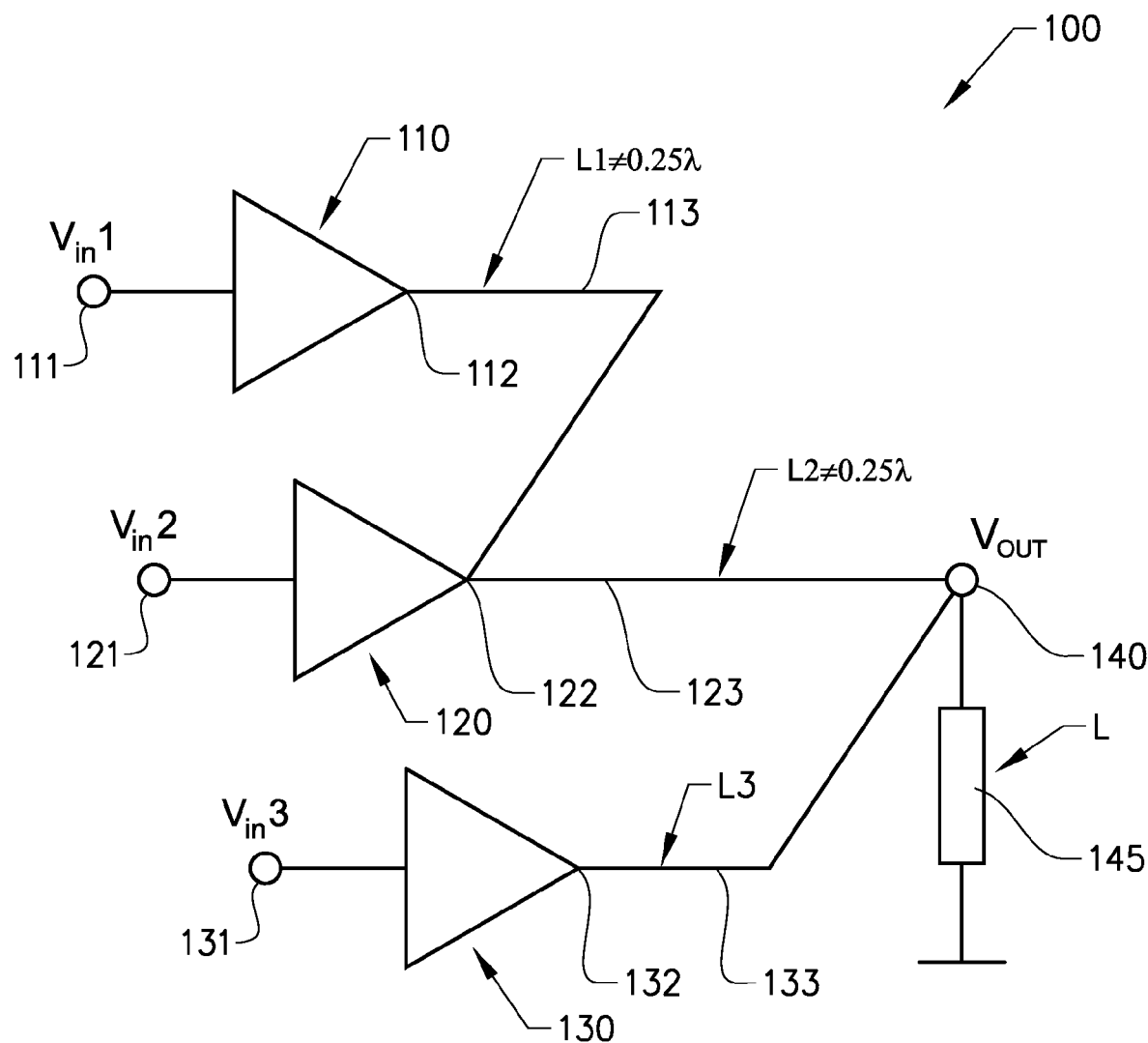
FIG. 1 shows one embodiment of the invention.

FIG. 1 shows a schematic view of a first embodiment 100 of a multi stage amplifier of the invention: as can be seen here, the multi stage amplifier 100 of the invention in this embodiment comprises a first sub-amplifier 110, which has an input port 111 and an output port 112.

The multi stage amplifier 100 also comprises a second sub amplifier 120, which has an input port 121 and an output port 122. As can be seen in FIG. 1, the output port 112 of the first sub-amplifier 110 is connected to the output port 122 of the second sub-amplifier 120 via a connection 113 which has an electrical length L1.

In addition, the output port 122 of the second sub-amplifier is connected to a common output port 140 for the entire multi-stage amplifier 100 via a connection 123 which has an electrical length L2. Also shown symbolically in FIG. 1 is an external load L, shown as 145, to which the multi stage amplifier 100 is connected.

The multi stage amplifier 100 of the invention also comprises a third sub-amplifier 130, with an input port 131 and an output port 132. The output port 132 of the third sub-amplifier 130 is connected to the common output port 140 via a connection 133 with an electrical length L3.

In order for the desired lower losses to be obtained in the amplifier 100, the first sub-amplifier 110 should generally be smaller than the second sub-amplifier 120 in terms of peak output power.

The first sub-amplifier 110 may also be seen as an "outer" sub-amplifier in the circuit 100, while the second sub-amplifier 120 is seen as an "inner" sub-amplifier in the same circuit 100.

According to the present invention, the electrical lengths L1 and L2 are chosen so that their combination gives a useful load transformation for the outer sub-amplifier 110, while allowing the inner sub-amplifier 120 to contribute efficiently in the upper amplitude region.

In general terms, this can be obtained by means of letting both L1 and L2 be longer or shorter than one quarter of a wavelength of the frequency for which the multi-stage amplifier is intended to operate. More specific examples of these lengths will be given in the following.

The electrical length L3 in the second branch is chosen so that it complements the effective electrical length L1 or L2. This determines if Chireix characteristics are obtained by the multi stage amplifier 100 in a lower or an upper amplitude region, or in both amplitude regions. More specific examples of this length will be given in the following.

Examples of combinations of L1 and L2 which fulfil the conditions given above, and which may thus be used in embodiments of the invention are the following: [L1, L2]= [0.35, 0.35] or [0.15, 0.15] or [0.35, 0.15] or [0.15, 0.35] or [0.2, 0.2], expressed as wavelengths, λ, of the frequency for which the multi-stage amplifier is intended to operate.

Concerning L3, a suitable length for L3 is that the sum of the electrical lengths L3 and L1 is one half wavelength, λ, of the frequency for which the multi-stage amplifier is intended to operate.

In one embodiment of the multi-stage amplifier 100, in order for the electrical lengths to fulfil the conditions given above, the electrical lengths L1, L2 and L3 are chosen as follows, with λ designating the wavelength of the intended operational frequency of the multi-stage amplifier 100:

$$\left.\begin{matrix} L1 = 0.35\ \lambda \\ L2 = 0.35\ \lambda \\ L3 = 0.18\ \lambda \end{matrix}\right\} \quad (1)$$

With such a choice of electrical lengths, Chireix action is obtained between the first 110 and second 120 sub-amplifiers and the third sub-amplifier 130.

Figure 2:
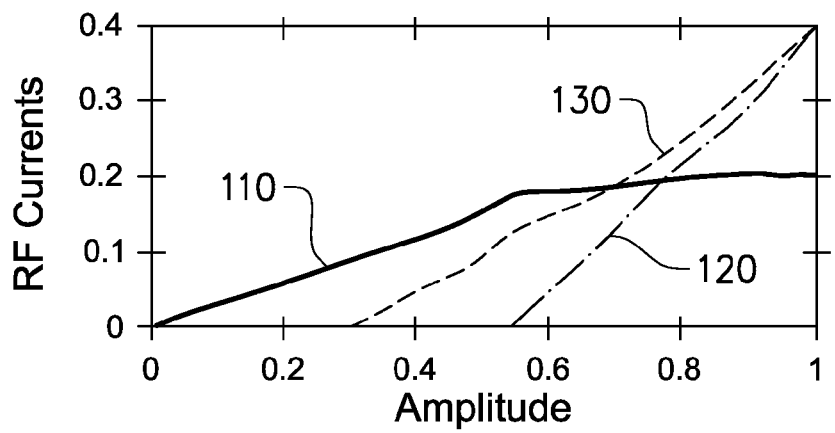
FIGS. 2-5 show characteristics obtained by the embodiment of FIG. 1.
Figure 3:
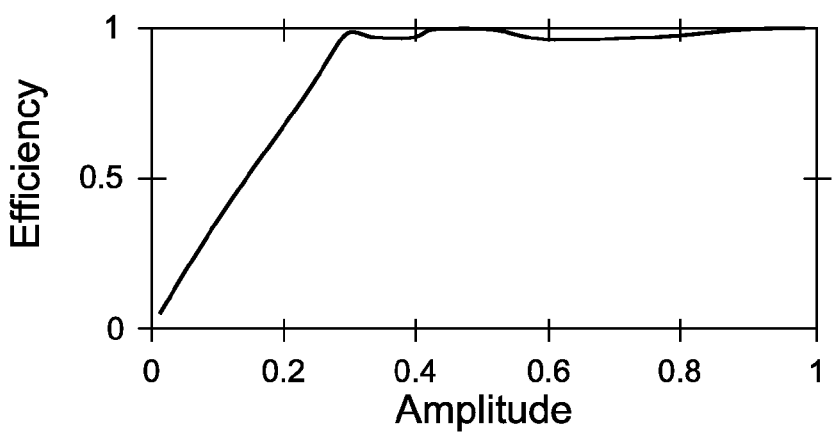

FIG. 2 shows the RF currents in the three sub-amplifiers as a function of the amplitude which is obtained by the electrical lengths in the example given in (1) above, and FIG. 3 shows the efficiency of the entire multi stage amplifier 100 as a function of amplitude with the electrical length of (1) above.

As can be seen in FIG. 2, the first sub-amplifier 110 draws considerably less current than the other two sub-amplifiers 120, 130 at higher amplitudes.

As an alternative to the electrical lengths described above in (1), it is also possible to design the multi stage amplifier 100 with electrical lengths L1, L2 and L3 which are the complementary lengths to those stated in (1) above, i.e. electrical lengths L1, L2 and L3 which each is 0.5λ minus the lengths stated above in (1). This will yield the same current and efficiency as those shown in FIG. 2, but the phase movements of the sub-amplifiers will be reversed.

With renewed reference to FIG. 2, it can be seen that the first sub-amplifier 110 is the only one which is active at the lower output amplitudes. This is the same irrespective of the electrical lengths chosen, i.e. either those given above or their complementary lengths.

In a further embodiment, the electrical lengths are instead as follows:

$$\left.\begin{matrix} L1 = 0.35\ \lambda \\ L2 = 0.15\ \lambda \\ L3 = 0.29\ \lambda \end{matrix}\right\} \quad (2)$$

Figure 4:
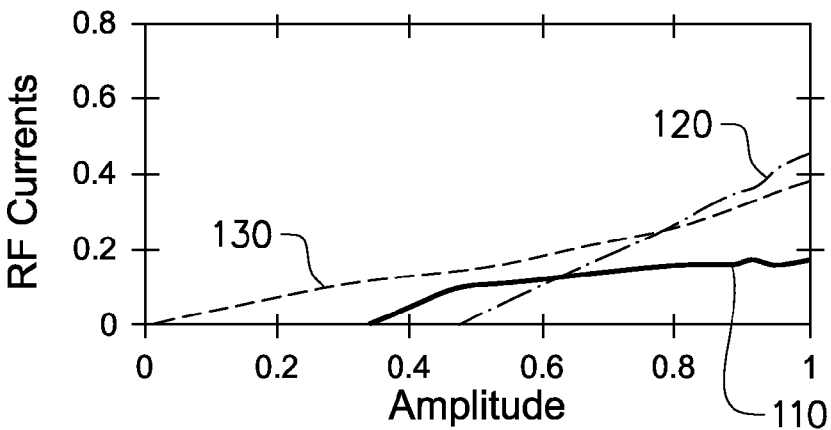
Figure 5:
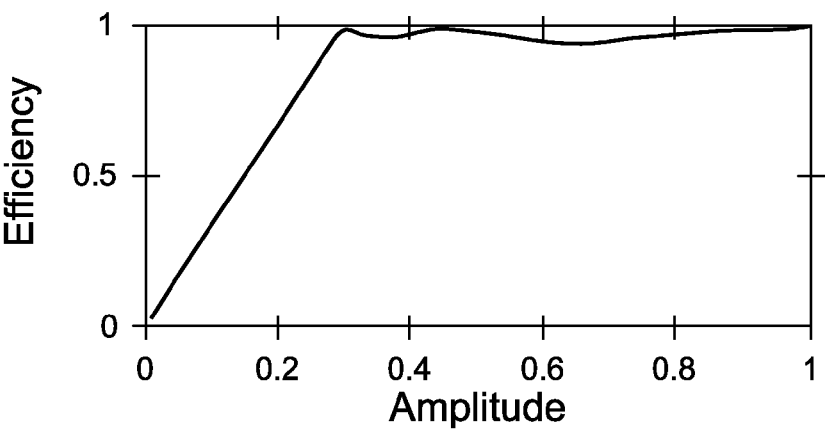

FIG. 4 shows the current vs. amplitude behaviour of the sub-amplifiers in this case, i.e. with the electrical lengths of (2) above; FIG. 5 shows the efficiency vs. amplitude of the entire multi-stage amplifier if the electrical lengths are chose as described in that case, i.e. (2) above. As can be seen in FIG. 4, in this case, the third sub-amplifier 130 is the one that is active in the lower amplitude regions, and as seen in FIG. 5, a high degree of efficiency is obtained in this embodiment as well.

Useful combinations of L1 and L2 have also been found to be as follows: L1 and L2 are chosen so that one of them is chosen from one of the following ranges, and the other is chosen from the other of the following ranges: [0.02-0.23], [0.27-0.48], with the lengths in the ranges being expressed as wavelengths, λ, of the frequency at which the multi-stage amplifier is intended to operate. Thus, if L1 is chosen from the range [0.02-0.23], then L2 should be chosen from the range [0.27-0.48], and vice versa.

Figure 6:
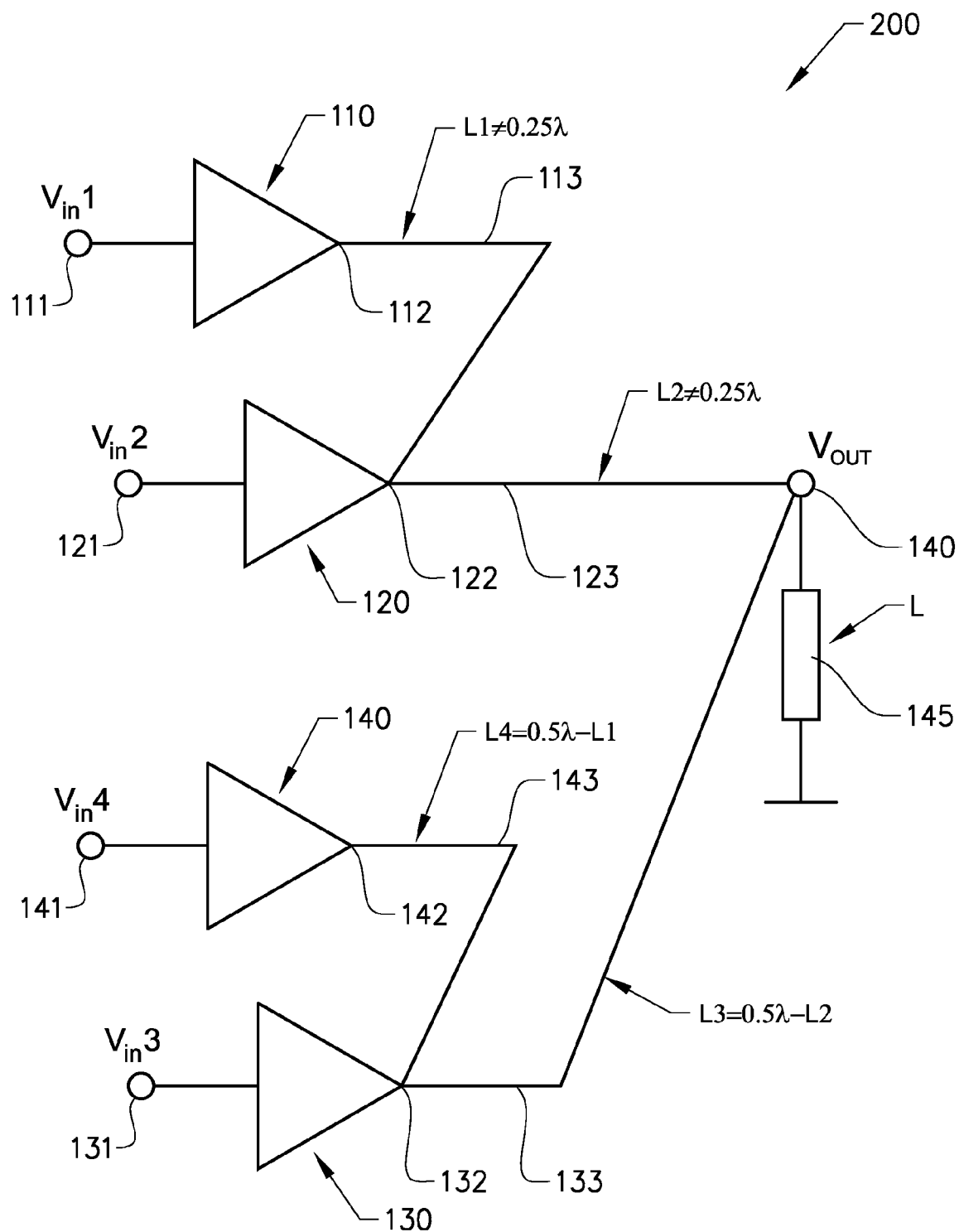
FIG. 6 shows a second embodiment of the invention.

In a further embodiment of the multi-stage amplifier of the invention, shown as 200 in FIG. 6, the multi-stage amplifier comprises a fourth sub-amplifier 140, which has an input port 141 and an output port 142. The output port 142 of the fourth sub-amplifier 140 is connected to the output port 132 of the third sub-amplifier 130 by means of a connection which has an electrical length L4.

In FIG. 6, which shows the embodiment 200, components which were also shown in FIG. 1 have retained their reference numbers.

It will be seen that the first 110 and second 120 sub-amplifiers form a first "branch" of the multi-stage amplifier 200 which is essentially duplicated by a similar second "branch" formed by the third 130 and fourth 140 sub-amplifiers.

Before the characteristics obtained by means of the multi stage amplifier 200 shown in FIG. 6 are described, it will be pointed out that a multi stage amplifier of the present invention can comprise a number of sub-amplifiers which is more or less arbitrary; in the case of an odd number of sub-amplifiers, the principles used for the multi-stage amplifier shown in FIG. 1 should be adhered to, i.e. a number of "branches" like the branch formed by the first 110 and second 120 sub-amplifier and an "outer" sub-amplifier connected as the third sub-amplifier 130 in FIG. 1.

In the case of an even number of sub-amplifiers, the principles described in connection to the multi-stage amplifier 200 of FIG. 6 should be adhered to, i.e. that of a number of branches which each consist of two sub-amplifiers connected as the two branches in FIG. 6.

Figure 7:
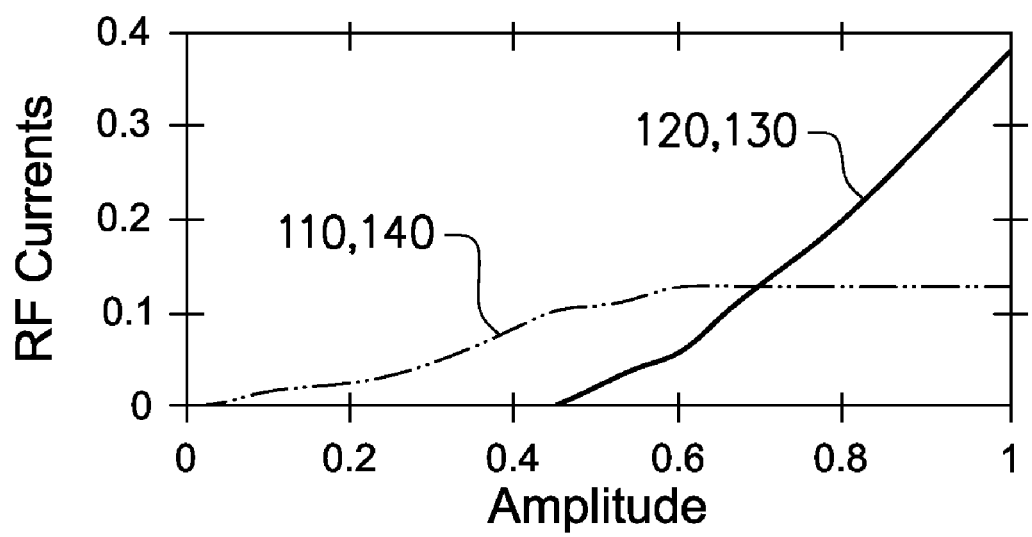
FIGS. 7 and 8 show characteristic of the embodiment of FIG. 6, and
FIGS. 9 and 10 show possible circuit designs for use in the invention.

Returning now to the characteristics obtained by means of the "two-branch" multi-stage amplifier 200 of FIG. 6, the current vs. amplitude characteristics of the first pair of sub-amplifiers 110,140 and the second pair of sub-amplifiers 120, 130 are shown in FIG. 7. We see that sub-amplifiers 110, 140 are the ones that are active at lower amplitudes, and that this pair of sub-amplifiers draws much less current than the other pair at higher amplitudes.

Figure 8:
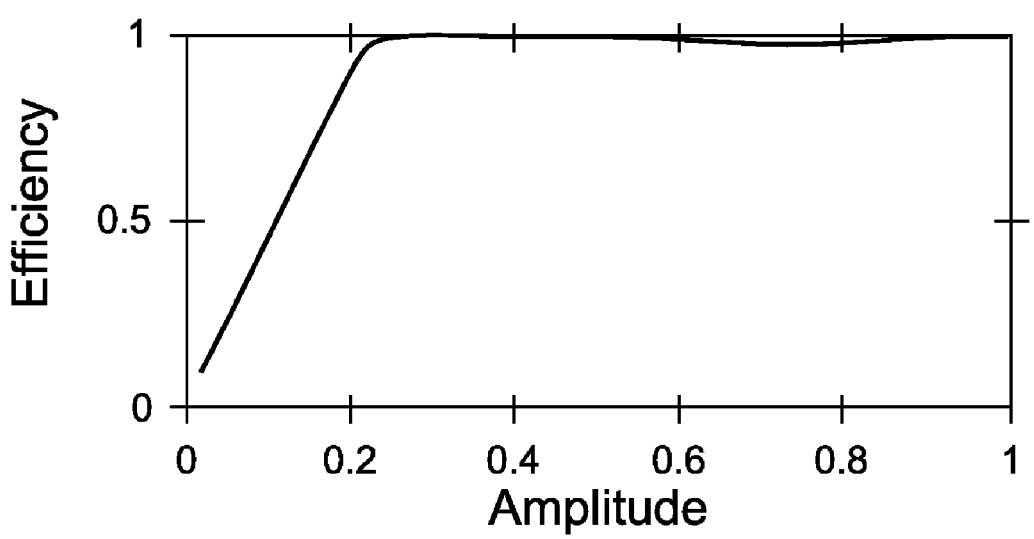

FIG. 8 shows the efficiency vs. amplitude characteristic of the multi-stage amplifier 200 of FIG. 6: as seen here, this embodiment of the invention also exhibits a high degree of efficiency.

Concerning the electrical lengths of the connections of the multi stage amplifier 200 of FIG. 6, the following have been found to be useful combinations: L4 and L1 are chosen from among the following ranges: [0.02-0.23], [0.27-0.48], in which ranges the lengths are expressed as wavelengths, λ, of the frequency at which the multi-stage amplifier 200 is intended to operate. Thus if L4 is chosen in the range [0.02-0.23], then L1 should be chosen in the range [0.27-0.48], and vice versa.

Similarly, the following have been found to be useful combinations of L3 and L2: L3 and L2 are chosen from among the following ranges: [0.02-0.23], [0.27-0.48], in which ranges the lengths are expressed as wavelengths, λ, of the frequency at which the multi-stage amplifier 200 is intended to operate. Thus if L3 is chosen in the range [0.02-0.23], then L2 should be chosen in the range [0.27-0.48], and vice versa.

Also, a useful combination of L1 and L4 is to let the sum of L1 and L4 be one half of the operational wavelength, λ, of the multi-stage amplifier.

Figure 9:
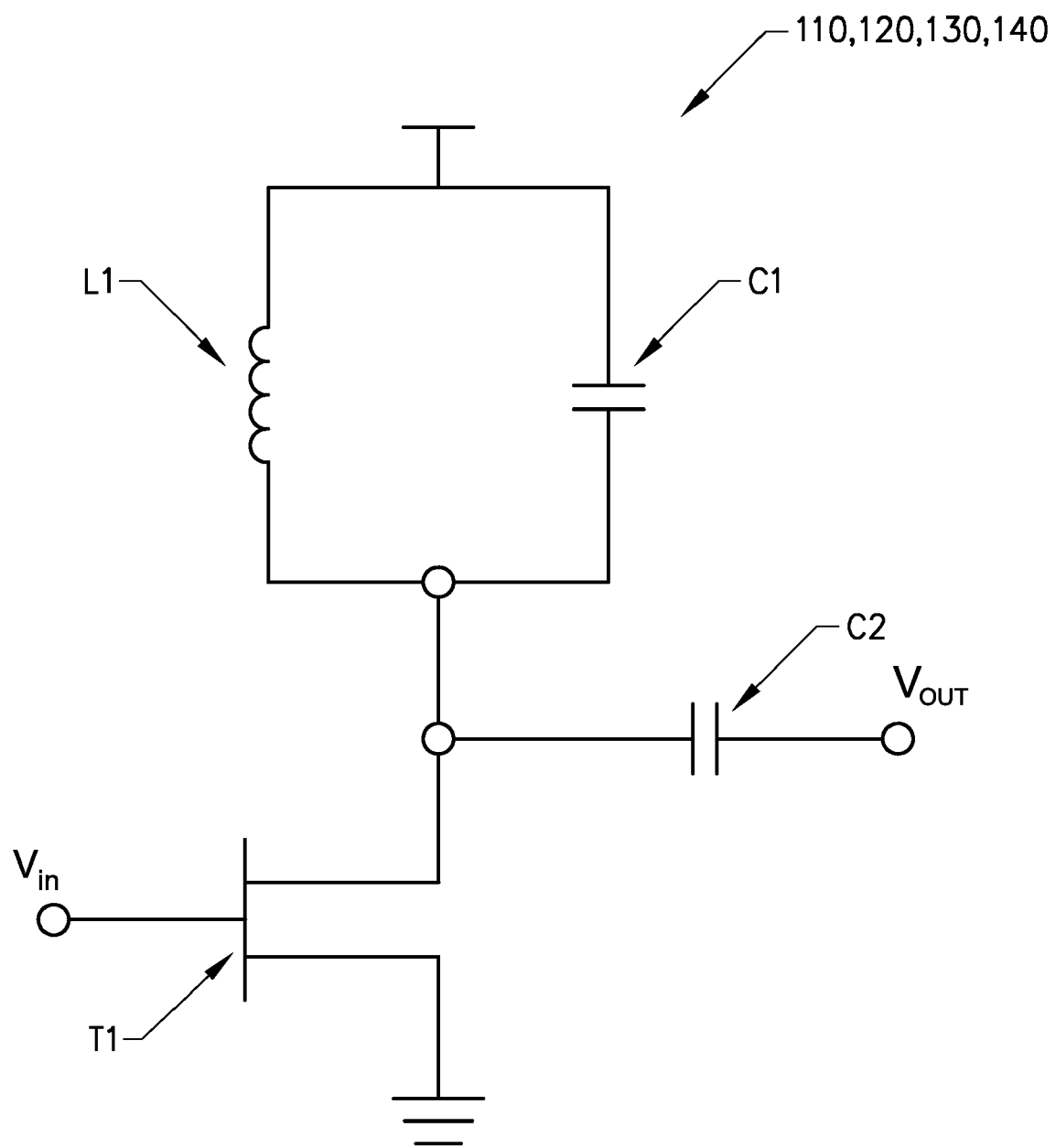

Regarding the sub-amplifiers which are comprised in the different embodiments of the invention, their exact design can be varied within the scope of the invention, as will be realized by those skilled in the art, but a possible realization of a sub-amplifier is shown in FIG. 9. As can be seen, this sub-amplifier comprises a FET-transistor, to which an LC-circuit (L1, C1 in parallel) is coupled at the drain of the transistor, and the source of the FET transistor is coupled to ground. The gate of the FET transistor is used as input port Vin for the sub-amplifier, and the drain is used as its output port Vout, via a capacitance C2.

FIG. 9 shows the sub-amplifier of FIG. 1, but with the circuit shown in FIG. 8 as the sub-amplifiers, for the sake of clarity.

Figure 10:
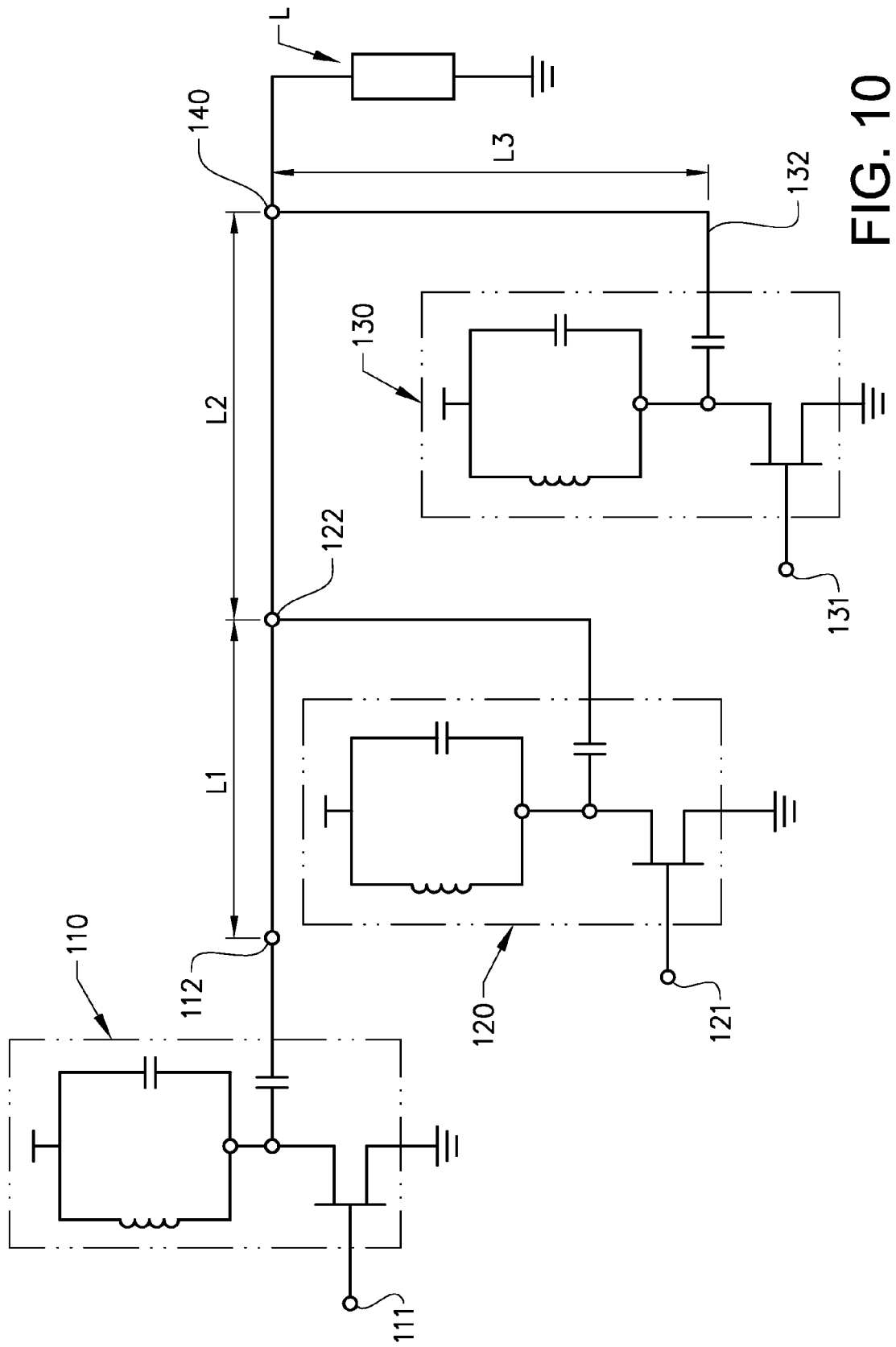

As an obvious alternative, the sub-amplifiers 110, 120, 130, 140 can be designed using bipolar transistors instead of the FET-transistors which were shown in FIGS. 9 and 10.

The invention is not limited to the examples of embodiments described above and shown in the drawings, but may be freely varied within the scope of the appended claims.

The invention claimed is:

1. A multi-stage amplifier comprising:
a first, a second and a third sub-amplifier, each with respective input and output ports; and
a common output port;
wherein the output port of the second sub-amplifier is connected via a first connection having a first electrical length L1 to the output port of the first sub-amplifier and is connected via a second connection having a second electrical length L2 to the common output port, the output port of the first sub-amplifier being connected to the common output port via the second connection, and the output port of the third sub-amplifier is connected via a third connection having a third electrical length L3 to the common output port;
wherein the first connection comprises a first electrical conductor and the second connection comprises a second electrical conductor, such that the first and second electrical conductors are separate conductors; and
wherein the electrical lengths L1, L2 of the connections from the second sub-amplifier's output port both to the first amplifier's output port and to the common output port are longer or shorter than one quarter of a wavelength ($\lambda$) of the frequency for which the multi-stage amplifier is intended to operate.

2. The multi stage amplifier of claim 1, in which the electrical lengths L1, L2 of the connections from the second sub-amplifier's output port to the first amplifier's output port and to the common output port are one of the combinations comprising: [0.35$\lambda$, 0.35$\lambda$], [0.15$\lambda$, 0.15$\lambda$] [0.35$\lambda$, 0.15$\lambda$], [0.15$\lambda$, 0.35$\lambda$], and [0.2$\lambda$, 0.2$\lambda$], where $\lambda$ is the wavelength of the frequency for which the multi-stage amplifier is intended to operate.

3. The multi-stage amplifier of claim 1, in which a sum of the electrical lengths L3, L1 of the connection from the third sub-amplifier's output port to the common output port and the connection from the output port of the first amplifier to the second amplifier's output port is one half of the wavelength ($\lambda$) of the frequency for which the multi-stage amplifier is intended to operate.

4. The multi stage amplifier of claim 1, in which the electrical lengths L1, L2 of the connections from the second sub-amplifier's output port to the first amplifier's output port and to the common output port are such that one of the electrical lengths is one of ranges [0.02$\lambda$-0.23$\lambda$] and [0.27$\lambda$-0.48$\lambda$], and the other electrical length is the other one of the ranges [0.02$\lambda$-0.23$\lambda$] and [0.2$\lambda$ 7-0.48$\lambda$], where $\lambda$ is the wavelength of the frequency at which the multi-stage amplifier is intended to operate.

5. The multi-stage amplifier of claim 1, in which an electrical length L3 of the connection from the output port of the third sub-amplifier to the common output port is 0.18$\lambda$, 0.29$\lambda$ or 0.32$\lambda$, where $\lambda$ is the wavelength at which the multi-stage amplifier is intended to operate.

6. The multi-stage amplifier of claim 1, further comprising a fourth sub-amplifier with an input port and an output port which is connected via a connection having an electrical length L4 to the output port of the third sub-amplifier.

7. The multi stage amplifier of claim 6, in which the electrical lengths L4, L1 of the connection from the fourth sub-amplifier's output port to the output port of the third sub-amplifier and the connection from the output port of the first sub-amplifier to the output port of the second sub amplifier are one of the ranges comprising: [0.02$\lambda$-0.23$\lambda$] and [0.27$\lambda$-0.48$\lambda$], where $\lambda$ is the wavelength of the frequency at which the multi-stage amplifier is intended to operate.

8. The multi stage amplifier of claim 6, in which the electrical lengths L3, L2 of the connection from the third sub-amplifier's output port to the common output port and the connection from the output port of the second sub-amplifier to the common output port of the multi-stage amplifier are one of the ranges comprising: [0.02$\lambda$-0.23$\lambda$], [0.27$\lambda$-0.48$\lambda$], where $\lambda$ is the wavelength of the frequency at which the multi-stage amplifier is intended to operate.

9. The multi stage amplifier of claim 6, in which a sum of the electrical lengths L4, L1 of the connection from the fourth sub-amplifier's output port to the output port of the third sub-amplifier and the connection from the output port of the first sub-amplifier to the output port of the second sub amplifier is one half of the wavelength ($\lambda$) of the frequency for which the multi-stage amplifier is intended to operate.

10. The multi stage amplifier of claim 6, in which a sum of the electrical lengths L3, L2 of the connection from the third sub-amplifier's output port to the common output port and the connection from the output port of the second sub-amplifier to the common output port of the multi-stage amplifier is one half of the wavelength ($\lambda$) of the frequency for which the multi-stage amplifier is intended to operate.

11. The multi-stage amplifier of claim 1, in which at least one of the sub-amplifiers comprises a FET transistor.

12. The multi-stage amplifier of claim 1, in which at least one of the sub-amplifiers comprises a bipolar transistor.

* * * * *